US007759158B2

(12) United States Patent
Bachrach et al.

(10) Patent No.: US 7,759,158 B2
(45) Date of Patent: Jul. 20, 2010

(54) SCALABLE PHOTOVOLTAIC CELL AND SOLAR PANEL MANUFACTURING WITH IMPROVED WIRING

(75) Inventors: Robert Bachrach, Burlingame, CA (US); Wendell T. Blonigan, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1174 days.

(21) Appl. No.: 11/367,068

(22) Filed: Mar. 3, 2006

(65) Prior Publication Data

US 2006/0213548 A1   Sep. 28, 2006

Related U.S. Application Data

(60) Provisional application No. 60/664,320, filed on Mar. 22, 2005.

(51) Int. Cl.
*H01L 21/00* (2006.01)
*H01L 31/00* (2006.01)

(52) U.S. Cl. .................. 438/80; 438/67; 257/E21.242; 136/255

(58) Field of Classification Search .................. 438/80, 438/67; 257/E21.242, E21.261, E21.579; 136/255, 252, 251
See application file for complete search history.

(56) References Cited

U.S. PATENT DOCUMENTS

| 4,461,922 | A | * | 7/1984 | Gay et al. | 136/249 |
|---|---|---|---|---|---|
| 4,542,257 | A | | 9/1985 | Fraser et al. | |
| 5,125,983 | A | | 6/1992 | Cummings | |
| 5,460,659 | A | | 10/1995 | Krut | |
| 5,476,553 | A | | 12/1995 | Hanoka et al. | |
| 5,478,402 | A | | 12/1995 | Hanoka | |
| 5,578,142 | A | | 11/1996 | Hattori et al. | |
| 5,716,459 | A | | 2/1998 | Chang et al. | |
| 6,262,358 | B1 | | 7/2001 | Kamimura et al. | |
| 6,309,906 | B1 | | 10/2001 | Meier et al. | |
| 6,395,972 | B1 | | 5/2002 | Tran et al. | |
| 6,437,236 | B2 | | 8/2002 | Watanabe et al. | |
| 6,815,788 | B2 | | 11/2004 | Oka et al. | |

(Continued)

FOREIGN PATENT DOCUMENTS

JP      1994-151932      5/1994

(Continued)

OTHER PUBLICATIONS

Korean Office Action, Patent Application No. 10-2007-7023419, dated Apr. 23, 2009.

(Continued)

*Primary Examiner*—Walter L Lindsay, Jr.
(74) *Attorney, Agent, or Firm*—Patterson & Sheridan, LLP

(57) ABSTRACT

A method and apparatus for fabricating large scale PV cell and solar module/panel is disclosed. The method includes designing a PV cell wiring scheme for a number of PV cells and patterning a plurality of features on a large size silicon sheet. A number of large scale silicon sheets, having a number of PV cells on each silicon sheet, can be bonded to a wiring plane to directly manufacture into a solar module/panel. Each PV cell on the solar module is then isolated. Methods of the invention greatly cut down the cost of solar module/panel manufacturing and PV cell assembly.

21 Claims, 7 Drawing Sheets

U.S. PATENT DOCUMENTS

| | | | |
|---|---|---|---|
| 6,818,820 | B2 | 11/2004 | Matsushita et al. |
| 6,825,104 | B2 | 11/2004 | Horzel et al. |
| 6,830,740 | B2 | 12/2004 | Oki et al. |
| 6,835,888 | B2 | 12/2004 | Sano et al. |
| 6,844,568 | B2 | 1/2005 | Seki et al. |
| 6,846,984 | B2 | 1/2005 | Fath et al. |
| 6,858,791 | B2 | 2/2005 | Erban |
| 2003/0000568 | A1 | 1/2003 | Gonsiorrawski |
| 2006/0213548 | A1* | 9/2006 | Bachrach et al. ............ 136/251 |

FOREIGN PATENT DOCUMENTS

| | | |
|---|---|---|
| KR | 1019990067755 | 8/1999 |
| TW | 309662 | 7/1997 |
| TW | 320774 | 11/1997 |
| TW | 366153 | 8/1999 |
| TW | 536063 | 6/2003 |

OTHER PUBLICATIONS

International Search Report, Feb. 24, 2008.
PCT International Search Report and Written Opinion dated Aug. 29, 2007 for International Application No. PCT/US06/08269.
Erler, et al. "Solar cell processing steps applied on RIE textured silicon surfaces", Chemnitz University website located at: www.zfm.tu-chemnitz.de/pdf/annual_report_2002/special_report_17.pdf.

* cited by examiner

SCALABLE PHOTOVOLTAIC CELL AND SOLAR PANEL MANUFACTURING WITH IMPROVED WIRING

CROSS-REFERENCE TO RELATED APPLICATIONS

This application claims benefit of U.S. provisional patent application Ser. No. 60/664,320, filed Mar. 22, 2005, which is herein incorporated by reference.

BACKGROUND OF THE INVENTION

1. Field of the Invention

Embodiments of the present invention generally relate to photovoltaic/solar cell and solar panel manufacturing.

2. Description of the Related Art

Photovoltaics (PV) or solar cells are material junction devices which convert sunlight into direct current (DC) electrical power. A junction develops a photo-voltage while the area and other parameters of the device determine the available current. Practical solar panels are sized in area to deliver the needed amount of power and optimize other application parameters. Solar panels are created by tiling a number of solar cells together whose dimensions are optimized by a variety of manufacturing constraints to minimize the manufacturing cost. The number of individual solar cells used is also determined by trading off between panel operating voltage and current (I), since the wiring generates resistance (R) and thus contributes a power loss $(P_L)$ given by $P_L = I^2 \cdot R$.

One example of PV systems includes a stand-alone system which in general powers for direct use or with local storage. Another type of PV system is connected to conventional utility grid with the appropriate power conversion equipment to produce alternating current (AC) compatible with any conventional utility grid. Overall, PV systems can generate power for many uses, such as remote terrestrial applications, battery charging for navigational aids, telecommunication equipments, and consumer electronic devices, such as calculators, watches, radios, etc.

A typical PV cell includes a p-type silicon wafer or sheet typically less than about 0.3 mm thick with a thin layer of n-type silicon on top, forming a p-n junction, which creates an electric field. When exposed to sunlight (consisting of energy from photons), the p-n junction of the PV cell generates pairs of free electrons and holes. The electric field of the p-n junction separates the free electrons and holes, creating a voltage. A circuit from n-side to p-side allows the flow of electrons when the PV cell is connected to an electrical load. Electrical power is the product of the voltage times the current generated as the electrons and holes recombine. Optimized solar cells usually mean maximum power generated at minimum cost.

Depending on the end use application, a variety of other parameters are considered. As an example, one or both surfaces of a PV cell are coated with suitable dielectrics after the p-n Junction is formed. The dielectric layers are used to minimize surface recombination and on the front provide antireflective coating to reduce reflection losses of photons. The bottom of the PV cell is generally covered with a back metal which provides contact for good conduction as well as high reflectivity. The front or sun facing side of the PV cell is covered with area minimized metallic contact grid for transporting current and minimizing current losses due to resistance through the silicon layers. Some blockage of sunlight or photons by the contact grid is unavoidable but can be minimized. Metal grids with patterns of conductive metal lines are used to collect current. The final step is a glass cover plate which protects the PV cell and provides structural re-enforcement.

Solar cells and PV panels currently are manufactured by starting with many small silicon sheets or wafers as material units and processed into individual photovoltaic cells before they are assembled into PV module and solar panel according to a variety of contacting or wiring schemes. These silicon sheets are generally saw-cut p-type boron doped silicon sheets, precut to the sizes and dimensions that will be used, e.g., 10 cm×10 cm, or 21 cm×21 cm. Originally these sizes were derived from available single crystal wafer sizes, but the advent of cast multi-crystalline silicon and ribbon technology has created more freedom in choosing sheet sizes for cell formation and optimizing production.

The cutting (sawing) or ribbon formation operation leaves damage to the surfaces of the precut silicon sheets, and one or more etching processes are performed on both surfaces of the silicon sheets to etch off about ten to twenty microns in thickness from each surface and provide surface textures thereon. Next, n-type doped silicon is formed by thermal or rapid thermal diffusion, e.g., by phosphorus diffusion penetrated up to a maximum of about 0.5 microns deep. Then, p-n junction isolation is performed at the edges of the silicon sheets by sand blasting, plasma etch or laser cutting. Additionally, the front side of the silicon substrates is covered with a deposited layer of antireflective coating made of a dielectric material, such as silicon dioxide, titanium dioxide, or silicon nitride which also provide as a barrier to surface recombination. Silicon nitride is currently the preferred primary dielectric film.

In general, screen printing thick-film technology is then used in the PV cell industry to layer a conductive paste of metal materials, e.g., silver, etc., into a desired pattern and deposit a metal material layer to the surface of the silicon sheets/substrates for forming metal contact fingers or wiring channels. Other thin film technologies may be used for contact formation or electrode processing. The deposited metal layer, formed into contacts, is often fired or sintered at high temperature to form into good conductors in direct contact with underlying silicon materials, and a single PV cell is made.

A solar module is formed by tiling a number of individual PV cells arrayed and bonded onto protective films and a carrier glass to create a solar panel appropriately sized for the required power output and wired to achieve the desired operating voltage and current. Currently, many different wiring/interconnect schemes can be used for contact patterning and current collection; for example, schemes using both front and back side wiring, schemes using front side current collection but all the contacts are brought to the back side, and other wiring schemes. Front side generally refers to the side facing sunlight.

FIGS. 1A-1E demonstrates a basic PV module fabrication process for PV cells. In general, as shown in FIG. 1A, after a single PV cell 110 is finished, metal tabs 104 are soldered to bus bars 102 on the surface of the PV cell. As shown in FIG. 1B, two or more metal tabs 104 per cell can be used to wire metal contacts or metal fingers 108 on each PV cell 110, provide interconnect links between PV cells 110, and allow thermal expansion. Regardless of size, a single PV cell generally produces about 0.5-0.6 volt DC current.

In FIG. 1C, several PV cells 110 are interconnected in series or parallel electrical circuits into a PV module to produce higher voltage, current, and power levels. Interconnection wiring of each PV cell 110 into strings 106 or modules 120 is performed by soldering and wiring metal tabs 104 and auxiliary tabs together, using various wiring schemes. A common configuration uses about 36 connected PV cells for a maximum of about 15 volts, compatible with major appliances and appropriate for 12 volts battery charging.

As shown in FIGS. 1D and 1E, the PV module 120 is usually stacked with encapsulant materials, such as ethylene vinyl acetate (EVA) sheets 122, and covered with a front glass pane 140 and a back pane 130. The PV module 120 can further be sealed in protective laminates or barriers. A number of PV modules 120 can also be assembled into pre-wired panels 150 or arrays 160. Protection of the active PV devices during module construction directly affects the performance and lifetime of the final PV systems.

PV module or solar panel is often completed by manual assembly, wiring, and soldering. Machines do exist for tabbing, laminating, and curing, but automation is in need of further improvement. Overall, the manufacturing process leads to relatively inefficient manufacturing volume for handling large unit wiring assembly. Currently, the whole manufacturing process for making an installed PV system is very expensive.

Therefore, there is a need to improve the scalability of the manufacturing process and find various ways to reduce the manufacturing cost.

SUMMARY OF THE INVENTION

Aspects of the invention provide a method for volume manufacturing of a number of photovoltaic cells and solar modules with improved wiring. In one aspect, a method is provided for fabricating a solar module assembly, including bonding one or more substrates onto a wiring plane to form the solar module assembly, where each substrate is designed to separate into a plurality of photovoltaic cells. The method further includes separating each of the individually sized photovoltaic cells from the bonded one or more substrates on the solar module assembly after bonding the one or more substrates on the solar module assembly.

In another aspect, a solar module assembly is provided and includes a wiring plane having one or more substrates bonded thereon and a plurality of photovoltaic cells on each of the one or more substrates. The one or more substrates are bonded onto the wiring plane prior to the plurality of the photovoltaic cells are separated and isolated on each substrate.

In still another aspect, a method for fabricating a solar module assembly includes bonding one or more substrates onto a wiring plane having conductor patterns, arranging the one or more substrates on the wiring plane to align the one or more substrates with the conductor patterns for the plurality of photovoltaic cells to form the solar module assembly, and separating each of the individual photovoltaic cells on the solar module assembly. Each substrate is pre-assigned for manufacture the plurality of the photovoltaic cells. The bonding includes electrical connection of features, such as vias, on the one or more substrates to the wiring plane as well as adhesive bonding for mechanical support.

In still another aspect, a method for fabricating a solar module assembly includes patterning a plurality of features on one or more substrates, forming a plurality of contacts on front or back sides of the one or more substrates, forming current collection metal wiring on the one or more substrates, bonding the one or more substrates onto a wiring plane to form the solar module assembly, where each substrate is designed for manufacturing a plurality of photovoltaic cells, and separating each of the individual photovoltaic cell on the solar module assembly.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention provides method and apparatus to fabricate and manufacture a number of PV cells directly into a sized solar module or solar panel. One embodiment of the invention includes the use of a large size/scale substrate such that two or more PV cells can be processed and isolated thereon later in the process. The size of the individual PV cells can range, for example, from about 10 cm×10 cm to about 21 cm×21 cm, e.g., 15.6 cm×15.6 cm. However, smaller or lager sizes/dimensions can also be used to advantage. In contrast, prior art methods typically use one silicon substrate for processing into a single PV cell before individually assembling the processed PV cell into a solar module or panel.

The substrate of the invention can be any of the substrate types suitable for PV cell and solar module fabrication, e.g., monocrystalline silicon, polycrystalline silicon, amorphous silicon, silicon ribbon sheet, cadmium telluride, gallium arsenide, among others. The shape of the substrate can vary and is not limited to square, rectangle, circle, oval, etc. Each substrate may include a single p-n junction, a dual junction, a triple junction, tunnel junction, p-i-n junction, or any other types of p-n junctions created by suitable semiconductor materials for solar cell manufacturing. For example, phosphorus diffusion can be used to create p-n junction on a p-type boron doped silicon substrate sheet.

Figure 1A:
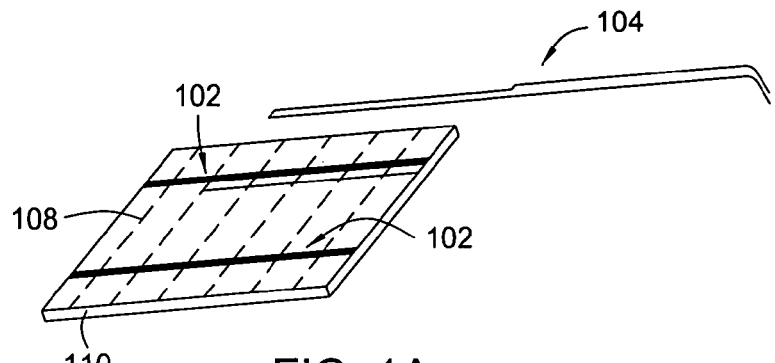
FIGS. 1A-1E illustrate a prior art manufacturing process, starting from a single PV cell and assembling into wired PV modules, panels, and arrays.
Figure 1B:
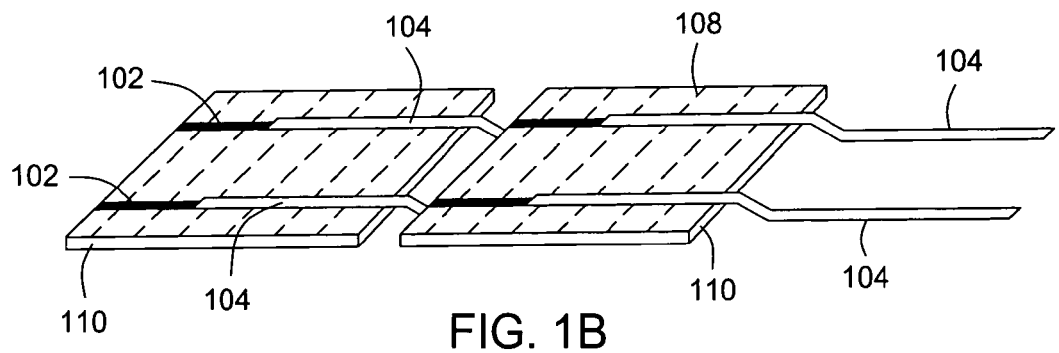
Figure 1C:
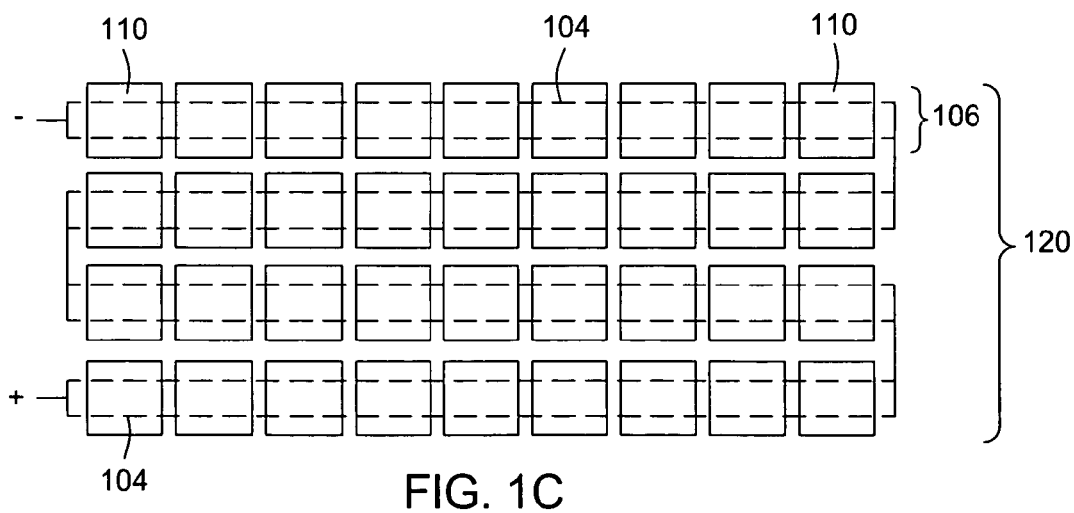
Figure 1D:
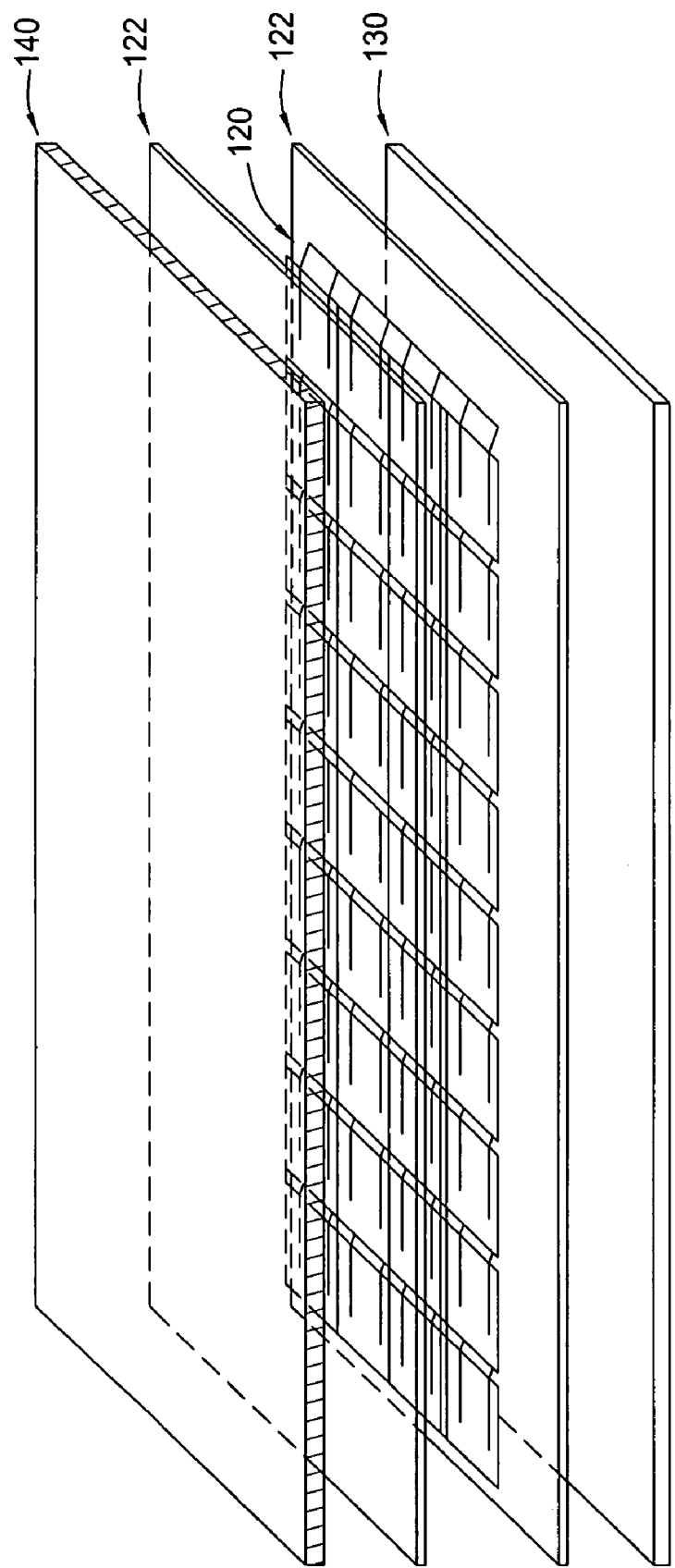
Figure 1E:
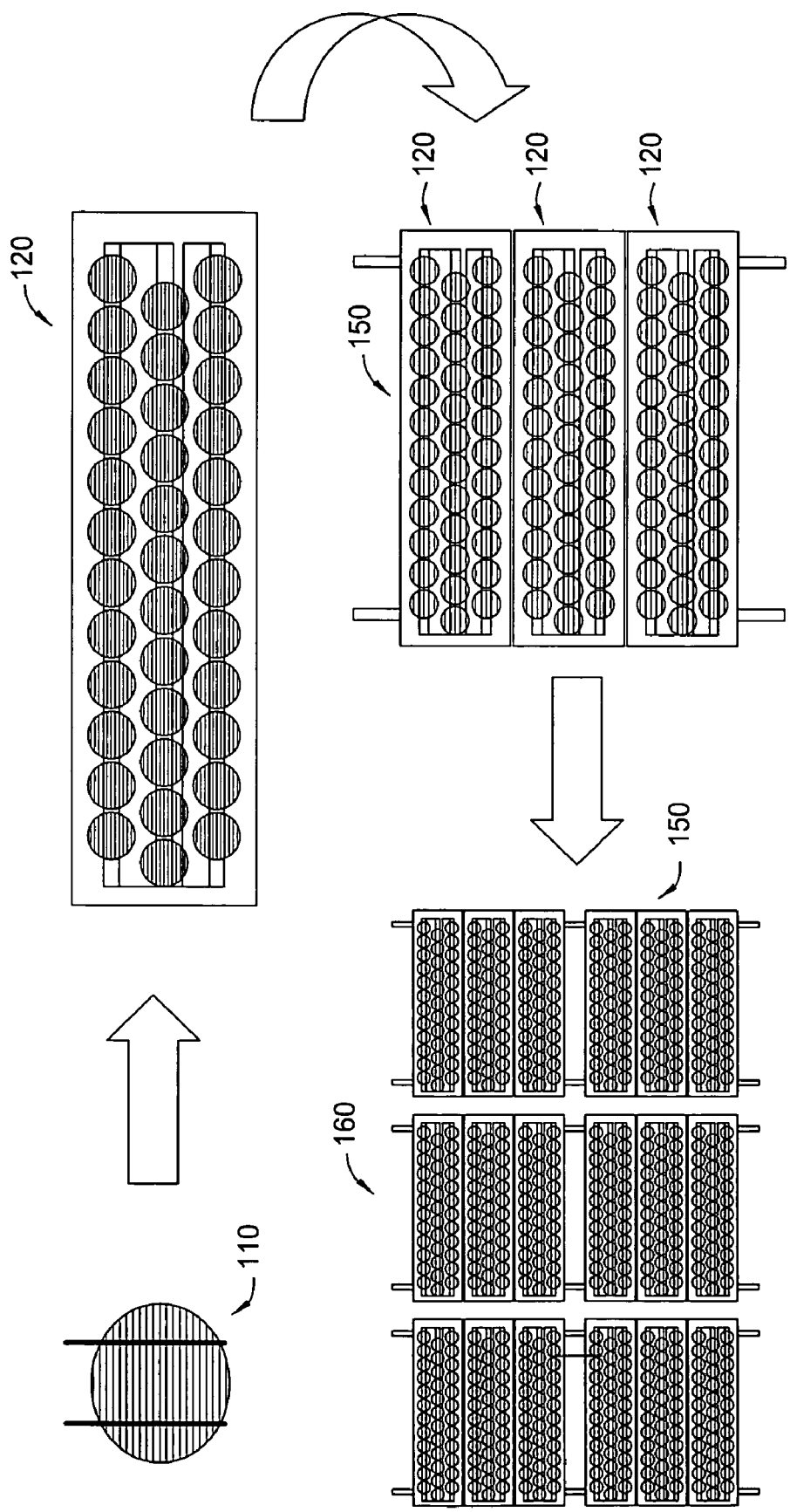
Figure 2:
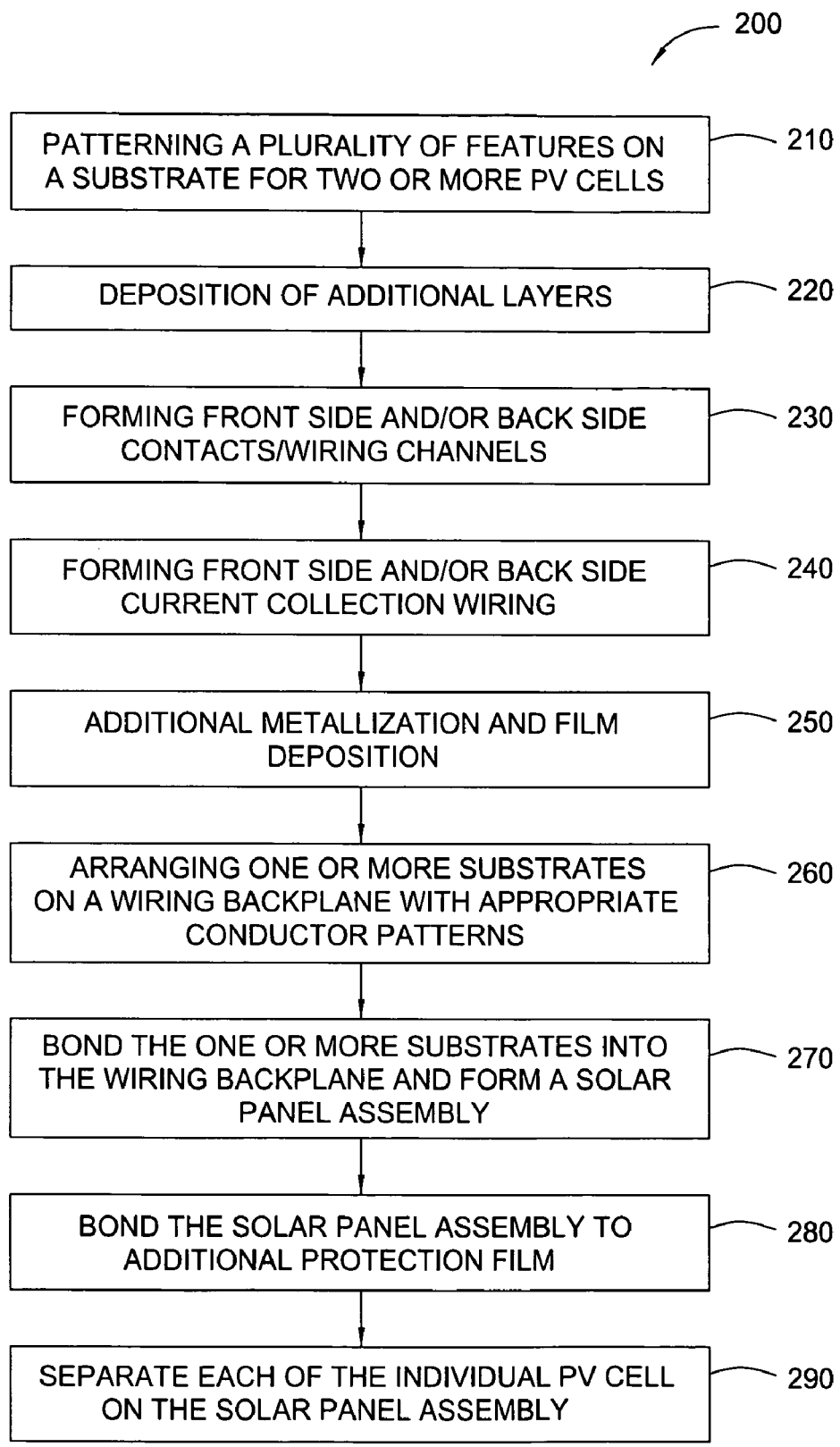
FIG. 2 is a process flow diagram illustrating an exemplary method incorporating one embodiment of the invention.

FIG. 2 depicts a process flow diagram illustrating one exemplary method 200 of the invention. The method 200 includes patterning a plurality of features on a large-scale substrate for two or more PV cells at step 210. Suitable features include vias, contacts, contact windows, trenches, among others. The plurality of the features can be patterned by any of suitable patterning techniques, including, but not limited to, dry etch, wet etch, laser drilling, chemical mechanical jet etch, and combinations thereof. One example of a chemical mechanical jet etch process is described in U.S. Pat. No. 6,699,356, entitled "Method and Apparatus for Chemical Mechanical Jet Etching of Semiconductor Structures," issued to Bachrach et al. and assigned to Applied Materials, Inc., which is hereby incorporated by reference to the extent not inconsistent with the disclosure herein. Optionally, before patterning the features on the full size substrate, a PV cell wiring scheme is designed virtually for a number of PV cells to be processed on the full size substrate. Virtual design of the wiring scheme directs how these PV cells can be fabricated into a solar panel and how wiring between PV cells can be used to collect current flowing through the contact connection of the PV cells to the wiring backplane.

At step 220, additional layers can be deposited on the substrate. For example, one or more passivation layer or anti-reflective coating layer can be deposited on the front and/or back side of the substrate. Various antireflective coating materials can be used, including various dielectric materials, such as silicon nitride, titanium oxide, amorphous carbon material, etc., suitable for use in PV cells exposed to the solar flux. The absorption coefficient of the antireflective coating materials should be minimized but can vary. In one example, a silicon nitride layer at a thickness of about 70 nm to about 80 nm can be deposited to the front and back side of the substrate as well as to the via walls and provide as a barrier layer, encapsulating layer, and/or antireflective coating. Optionally, additional layers of anti-reflection coating can be deposit for better index matching, such as a second front side dielectric antireflective coating layer.

At step 230, contacts, such as electrodes, contact windows, wiring channels, among others, are formed on the front and/or back side of the substrate such that suitable semiconductor contact can be formed by well established semiconductor processing methods. For example, front and backside contacts can be formed on substrates for PV cells and various types of vias can be formed to connect the front and back side contacts together for current collection and conducting electricity. Alternatively, all back contacts can be used to collect current and conduct electricity, leaving the front side of the PV cell for light absorption and improving performance.

At step 240, current collection wirings can be formed on the front or back side of the substrate using suitable wiring metallization technique. Silver is commonly used, but aluminum or copper wiring has cost and performance advantages and can be readily incorporated into the process described herein.

Figure 3:
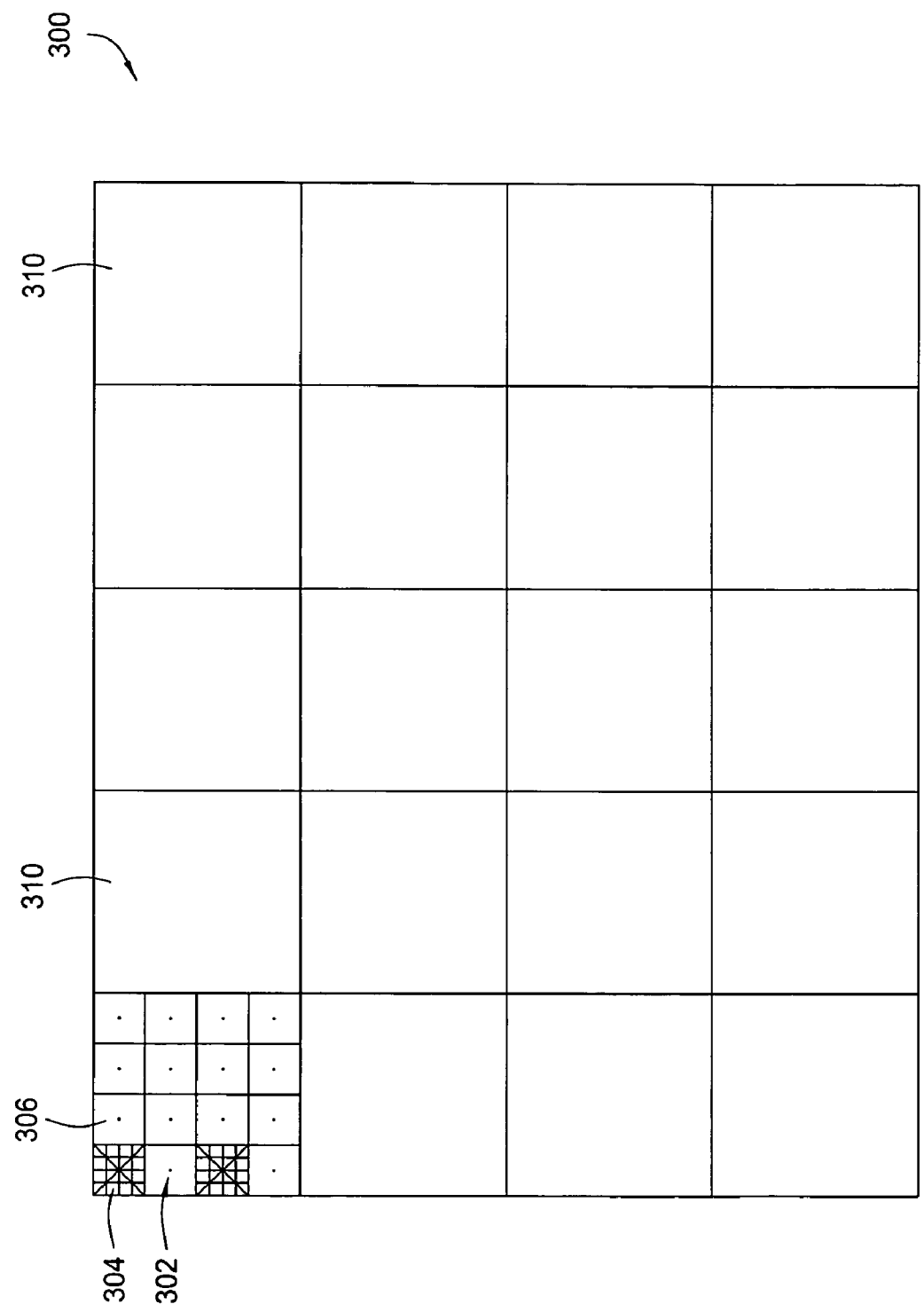
FIG. 3 illustrates one embodiment of an exemplary substrate for manufacturing a plurality of PV cells thereon.

As an example, FIG. 3 illustrates one exemplary substrate processing of the invention, including a substrate 300 of the invention designed virtually for processing into one or more PV cells 310, having one or more vias 302 which pass the front collected current to the backside of the substrate 300. The virtual design of the substrate 300 may also include various locations for conductive bonding pads to be formed on the wiring backplane. The bond pads are used to provide electrical connection between features, such as the one or more vias 302. In addition, the substrate 300 having the virtual PV cells 310 also includes one or more contacts or current collection wirings 304 for each of the virtual PV cell 310 located on the front side or back side of the substrate 300 such that the current collection wirings 304 are designed virtually before each of the PV cells 310 are formed. In addition, each PV cell 310 may be virtually designed into one or more sub-cells 306. The substrate 300 consists of virtually PV cells 310 and sub-cells 306 such that when each PV cell 310 is actually formed, they are optimized to generate maximum power.

In the example of FIG. 3, the substrate 300 may have a size of about 400 mm×500 mm to include total of twenty virtual PV cells, each having a size of about 100 mm×100 mm. As another example, the substrate 300 may have a size of about 200 mm×200 mm to include total of four virtual PV cells, each having a size of about 100 mm×100 mm. As still another example, the substrate 300 may have a size of about 600 mm×600 mm to include total of sixteen virtual PV cells, each having a size of about 150 mm×150 mm. One embodiment of the invention provides patterning of the one or more vias 302 on the substrate 300 which has been scaled-up to a larger size for accommodating two or more PV cells 310 and sub-cells 306 before each of the PV cells 310 are formed.

Referring back to FIG. 2, at step 250, additional metallization and film deposition required for different types PV cell is performed, depending on different applications used for laboratorial or industrial uses. Various types of PV cells may be desired to manufacture into a solar panel, including, thin film silicon cell, Passivated Emitter Rear Locally diffused (PERL) cell, Passivated Emitter Rear Totally diffused (PERT) cell, Zone-Melting Recrystallization (ZMR) cell, Surface Texture and enhanced Absorption with a back Reflector (STAR) cell, among others. For example, in some cases, metallization processing on the back side of the substrate may be optionally performed to deposit high reflectivity materials. Then, the substrate is ready to be manufactured into a solar module or panel.

At step 260, one or more substrates that have been processed by one or more steps of the invention as described above may be arranged on a wiring backplane for fabricating into a solar module/panel, such as by tiling up one or a number of the substrates of the invention on the wiring plane. The wiring plane can be any of the insulating wiring back planes suitable for PV module manufacturing, such as a metal foil or a thick metal film on a plastic film with suitable insulating and barrier properties. In general, silicon sheets of various scaled-up sizes can be tiled together into solar panel and solar module of various sizes. For example, solar module of 1200 mm×2000 mm in size can be formed by tiling up twelve (12) silicon substrates of 400 mm×500 mm in size onto a wiring plane; alternatively, sixty (60) silicon substrates of 200 mm×200 mm in size can be tiled together. Each silicon substrate may include desired numbers of PV cells and sub-cells which are designed virtually first.

In addition, the wiring backplane may include appropriate conductor patterns thereon for conducting current between PV cells with minimal resistivity loss. The backplane conductor patterns are designed to match with the virtual design of the wiring scheme for the substrate of the invention and individual PV cell. Forming or patterning a layer of a metal conductor on the wiring backplane creates the needed wiring. The wiring pattern reflects the needed connections for each of the final PV cell. The wiring conductor patterns include any of the suitable series-parallel organization/interconnection, depending on the design and intended use of the final solar panel to achieve the specified operative voltage and current.

Figure 4:
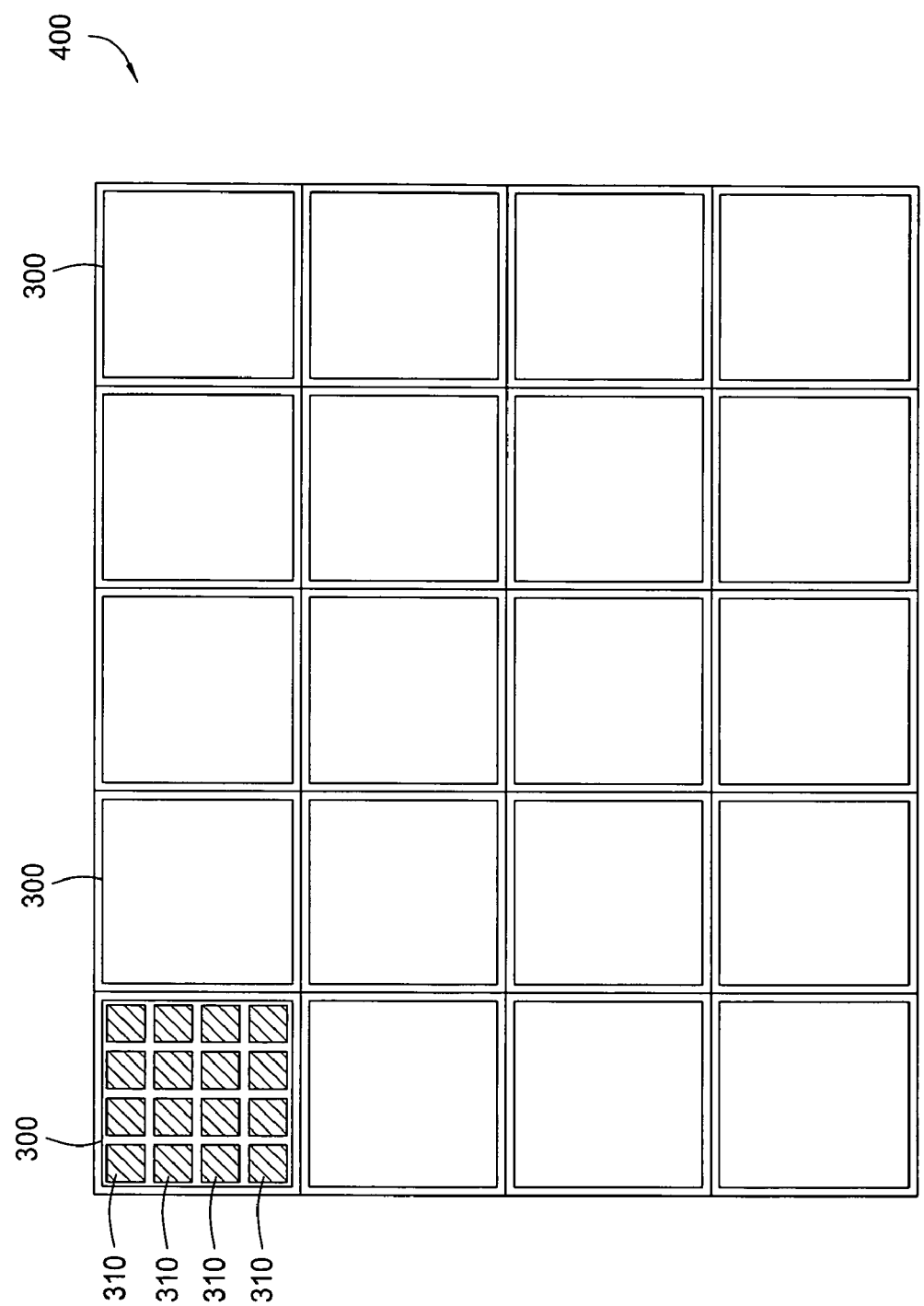
FIG. 4 illustrates the exemplary substrate of FIG. 3 arranged on an exemplary wiring plane according to one embodiment of the invention.

One example is shown in FIG. 4, which illustrates arranging one or more substrates 300 that have been processed according to embodiments of the invention on one side of a wiring plane 400 such that the PV cells 310 on each substrate 300 can be fabricated later. The PV cells 310 are virtually shown on one substrate 300 in FIG. 4, since individual PV cell 310 is not formed on the substrate at this stage yet. The one or more substrates 300 may be arranged to align with and match the conductor patterns located on the front side and/or back side of the wiring plane 400, according to embodiments of the invention. For example, the back side of the wiring plane 400 can be wired/interconnected for current collection, as illustrated in FIG. 5.

Figure 5:
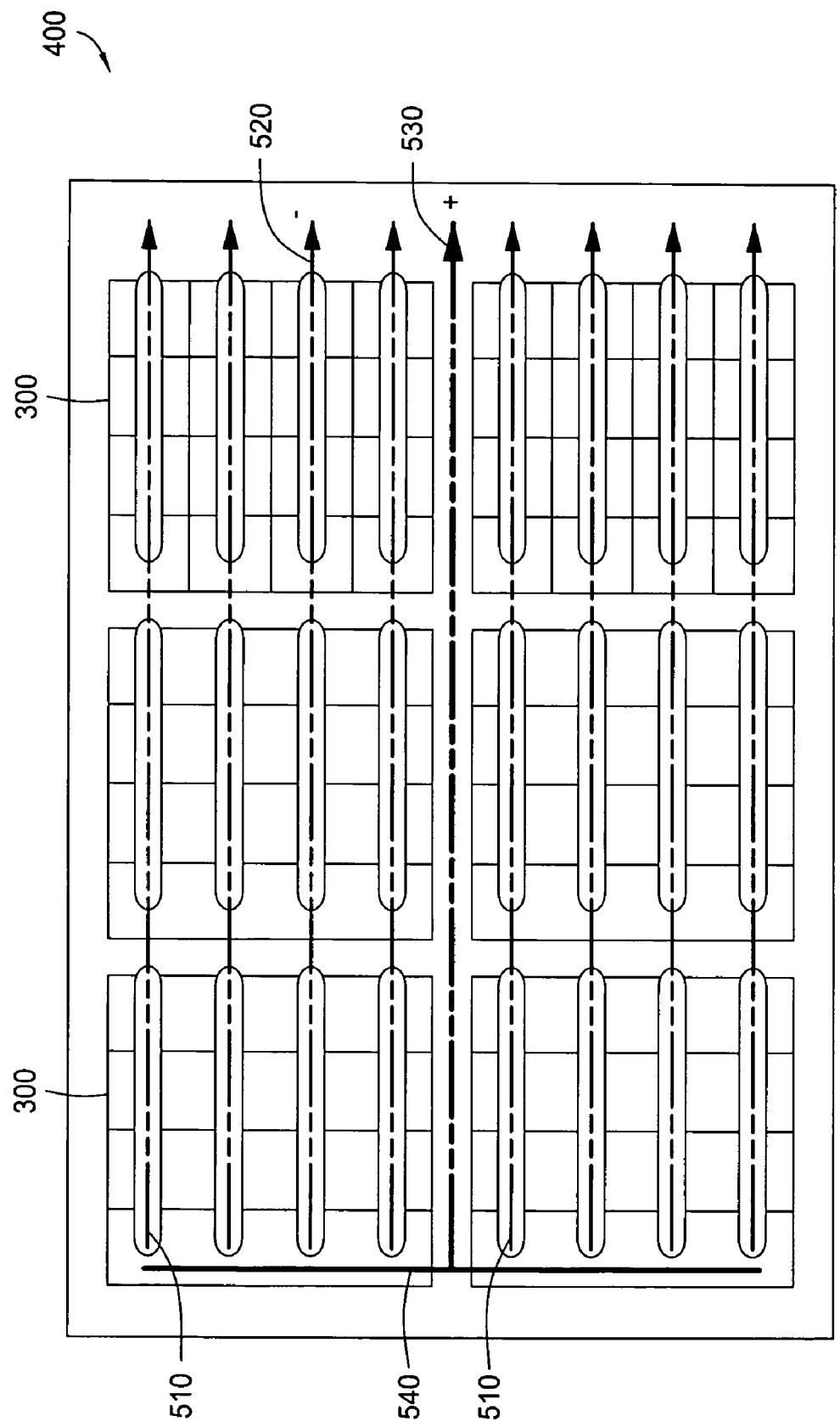
FIG. 5 illustrates one side of the exemplary wiring plane having current conducting, wiring patterns according to one embodiment of the invention.

In FIG. 5, the conductor patterns may include, for example, a plurality of metal tabs 510 and bus bars 540, fabricated on the wiring plane 400 before, after or at the same when the substrates 300 are arranged on the wiring plane 400. In addition, one exemplary wiring scheme of the invention may include the conductor patterns of the wiring plane 400 having one or more negative output leads 520 and one or more positive output leads 530, fabricated on the wiring plane 400. As shown in FIG. 5, the locations of a number of the output leads on the edges of the wiring plane 400 are optimized, for example, more than one set of voltage outputs can be used in a single panel. The overall scheme allows for various scalable sizes and numbers of PV cells to be formed on a single PV panel to lower wiring resistance and provide various current outputs, preferably larger current output. The locations of the plurality of PV cells, sub-cells on each of the one or more substrates have to be aligned with the conductor patters and matched to minimize wiring resistance and optimize output voltage.

Referring back to FIG. 2, at step 270, the one or more substrates, such as the large-size silicon sheets of the invention, can be bonded onto the wiring backplane to form into a solar module assembly. In addition, electrical connection between the wiring plane and features of PV cells are formed. For example, bond pads located on the silicon sheets/substrates for vias and features of the PV cells may be used for bonding to the wiring plane.

Bonding of the one or more substrates to the wiring plane can be performed by suitable techniques, including, not limited to, soldering with or without lead (Pb), epoxy, thermal annealing, ultrasonic annealing, among others, well known in semiconductor packaging. At step 280, the solar panel assembly can be bonded to additional protective films for adding mechanical strength and stability. One exemplary protective film is DuPont™ Tedlar® PVF (poly-vinyl fluoride). Protective films can be bonded to the back side of the wiring backplane to protect the conductor patterns and electrical output leads thereon from environmental corrosion or other damages while lightening the overall structure.

At step 290, individual PV cells on the solar panel assembly are separated or isolated without cutting the wiring plane. One aspect of the invention provides isolation of PV cells after they are bonded to a wiring plane, allowing any desirable scale-up for the manufacturing process of PV cells to greatly cut down the cost of manufacturing and cell assembly.

In an alternative embodiment of the invention, which provides a flexible approach when a smaller solar panel size is desired for some applications, the solar panel can be fabricated in large size to cut down the cost for manufacturing and the wiring plane can be cut into desired dimensions for further wiring and fabrication into PV modules of various desired sizes.

After each PV cell is isolated on the solar panel assembly, the output leads can further be properly connected for testing and one or more solar grade adhesives can be used to bond the solar panel assembly to appropriate solar grade cover glass for mechanical support. For example, ethylene vinyl acetate (EVA) adhesive can be used to tie the solar panel assembly to suitable solar panel support, such as glass, for sunlight to go through. In addition, the edge of the solar panel assembly may need to be sealed properly for easy installation of the solar panel assembly and environmental protection. Furthermore, one key embodiment of this invention provides large electric current handling capability of the interconnected wiring backplane because of the scale-up manufacturing of a large number of PV cells on the wiring backplane. In another embodiment, when the current collection wiring is located on the back side of the wiring backplane, eliminating the need for thick front surface conductors or front contacts, the approach allows the front surface active aperture to be optimized for maximum solar light collection. Various features of the invention, including the separation of the large silicon sheets into air isolated PV cells, the overall solar panel assembly separated into appropriate sized PV cells, and back side wiring/conductor pattern for current collection, among others, ensure desired operating voltage and output current to be achieved with minimal resistive loss of power by wiring patterns or current conducting patterns used. Further, one advantage of the invention is that scaling-up PV cells manufacturing on silicon substrates is compatible with automated PV module/panel manufacturing can to provide a more convenient and effective way for handling large-volume production.

In operation, an exemplary scalable PV cell and solar panel manufacturing scheme may include large silicon sheets of 400 mm×500 mm that can be processed into about 20 photovoltaic cells using front-side current collection and back-side contacts and wiring. The silicon sheets are packaged into solar panels by tiling and bonding these large silicon sheets onto an interconnection backplane by low resistivity bonding and connection techniques as described above. The Interconnection backplane provides the series parallel wiring pattern aligned with a isolation pattern of the silicon sheet for a number of PV cells and the back contacts for fabricating the PV cells.

One example of tilling a number of PV cells on a large size substrate is described in U.S. Pat. No. 6,818,529, entitled "Apparatus and Method for Forming a Silicon Film across the Surface of a Glass Substrate," issued to Bachrach et al. and assigned to Applied Materials, Inc., which is hereby incorporated by reference to the extent not inconsistent with the disclosure herein. In addition, Tables I-IV below list exemplary tiling of various sizes of silicon sheets containing large number of PV cells for manufacturing solar panels and their resulting output powers (in Watts).

TABLE I

Solar panel tiling examples using silicon sheets of various scalable sizes and their resulting output powers (in Watts).

Forced Area    W/sq meter = 150

| feet | | | mm | | | Meters | |
|---|---|---|---|---|---|---|---|
| l | x | w | sq | l | x | w | sq | watts |
| 1.0 | x | 2.0 | 2.0 | 304.8 | x | 609.6 | 0.19 | 27.87 |
| 1.3 | x | 1.6 | 2.2 | 400.0 | x | 500.0 | 0.20 | 30.00 |
| 2.0 | x | 2.0 | 4.0 | 609.6 | x | 609.6 | 0.37 | 55.74 |
| 2.0 | x | 4.0 | 8.0 | 609.6 | x | 1219.2 | 0.74 | 111.48 |
| 3.0 | x | 3.0 | 9.0 | 914.4 | x | 914.4 | 0.84 | 125.42 |
| 2.0 | x | 6.0 | 12.0 | 609.6 | x | 1828.8 | 1.11 | 167.23 |
| 3.0 | x | 4.0 | 12.0 | 914.4 | x | 1219.2 | 1.11 | 167.23 |
| 3.9 | x | 3.3 | 12.9 | 1200.0 | x | 1000.0 | 1.20 | 180.00 |
| 2.0 | x | 8.0 | 16.0 | 609.6 | x | 2438.4 | 1.49 | 222.97 |
| 3.0 | x | 8.0 | 24.0 | 914.4 | x | 2438.4 | 2.23 | 334.45 |
| 4.0 | x | 8.0 | 32.0 | 1219.2 | x | 2438.4 | 2.97 | 445.93 |

TABLE II

Solar module tiling examples of various sizes using silicon sheets of 150 mm × 150 mm and their resulting output powers (in Watts).

| Module Cell Tiling | | | | Module Integral Tiling | | | | | | | | |
|---|---|---|---|---|---|---|---|---|---|---|---|---|
| Size | 150 | mm | | feet | | | | mm | | | Meters | |
| l | w | # | area | l | x | w | sq | l | x | w | sq | watts |
| 2 | 4 | 8 | 0.18 | 0.98 | x | 1.97 | 1.94 | 300.0 | x | 600 | 0.18 | 27.00 |
| 2 | 3 | 6 | 0.14 | 0.98 | x | 1.48 | 1.45 | 300.0 | x | 450 | 0.14 | 20.25 |
| 4 | 4 | 16 | 0.36 | 1.97 | x | 1.97 | 3.88 | 600.0 | x | 600 | 0.36 | 54.00 |
| 4 | 8 | 32 | 0.72 | 1.97 | x | 3.94 | 7.75 | 600.0 | x | 1200 | 0.72 | 108.00 |
| 6 | 6 | 36 | 0.81 | 2.95 | x | 2.95 | 8.72 | 900.0 | x | 900 | 0.81 | 121.50 |
| 4 | 12 | 48 | 1.08 | 1.97 | x | 5.91 | 11.63 | 600.0 | x | 1800 | 1.08 | 162.00 |
| 6 | 8 | 48 | 1.08 | 2.95 | x | 3.94 | 11.63 | 900.0 | x | 1200 | 1.08 | 162.00 |
| 8 | 6 | 48 | 1.08 | 3.94 | x | 2.95 | 11.63 | 1200.0 | x | 900 | 1.08 | 162.00 |
| 4 | 16 | 64 | 1.44 | 1.97 | x | 7.87 | 15.50 | 600.0 | x | 2400 | 1.44 | 216.00 |
| 6 | 16 | 96 | 2.16 | 2.95 | x | 7.87 | 23.25 | 900.0 | x | 2400 | 2.16 | 324.00 |
| 8 | 16 | 128 | 2.88 | 3.94 | x | 7.87 | 31.00 | 1200.0 | x | 2400 | 2.88 | 432.00 |

TABLE III

Solar module tiling examples of various sizes using silicon sheets of 200 mm × 200 mm and their resulting output powers (in Watts).

| Module Cell Tiling | | | | Module Integral Tiling | | | | | | | | |
|---|---|---|---|---|---|---|---|---|---|---|---|---|
| | 200 | mm | | feet | | | | mm | | | Meters | |
| l | w | # | area | l | x | w | sq | l | x | w | sq | watts |
| 1 | 3 | 3 | 0.12 | 0.66 | x | 1.97 | 1.29 | 200.0 | x | 600 | 0.12 | 18.00 |
| 2 | 2 | 4 | 0.16 | 1.31 | x | 1.31 | 1.72 | 400.0 | x | 400 | 0.16 | 24.00 |
| 3 | 3 | 9 | 0.36 | 1.97 | x | 1.97 | 3.88 | 600.0 | x | 600 | 0.36 | 54.00 |
| 3 | 6 | 18 | 0.72 | 1.97 | x | 3.94 | 7.75 | 600.0 | x | 1200 | 0.72 | 108.00 |
| 4 | 4 | 16 | 0.64 | 2.62 | x | 2.62 | 6.89 | 800.0 | x | 800 | 0.64 | 96.00 |
| 3 | 9 | 27 | 1.08 | 1.97 | x | 5.91 | 11.63 | 600.0 | x | 1800 | 1.08 | 162.00 |
| 4 | 6 | 24 | 0.96 | 2.62 | x | 3.94 | 10.33 | 800.0 | x | 1200 | 0.96 | 144.00 |
| 6 | 5 | 30 | 1.20 | 3.94 | x | 3.28 | 12.92 | 1200.0 | x | 1000 | 1.20 | 180.00 |
| 3 | 12 | 36 | 1.44 | 1.97 | x | 7.87 | 15.50 | 600.0 | x | 2400 | 1.44 | 216.00 |
| 4 | 12 | 48 | 1.92 | 2.62 | x | 7.87 | 20.67 | 800.0 | x | 2400 | 1.92 | 288.00 |
| 6 | 12 | 72 | 2.88 | 3.94 | x | 7.87 | 31.00 | 1200.0 | x | 2400 | 2.88 | 432.00 |

TABLE IV

Solar module tiling examples of various sizes using silicon sheets of 400 mm × 500 mm and their resulting output powers (in Watts).

| Module Cell Tiling | | | | Module Integral Tiling | | | | | | | | |
|---|---|---|---|---|---|---|---|---|---|---|---|---|
| 400 | 500 | mm | | feet | | | | mm | | | Meters | |
| l | w | # | area | l | x | w | sq | l | x | w | sq | watts |
| 1 | 1 | 1 | 0.20 | 1.31 | x | 1.64 | 2.15 | 400.0 | x | 500 | 0.20 | 30.00 |
| 1 | 2 | 2 | 0.40 | 1.31 | x | 3.28 | 4.31 | 400.0 | x | 1000 | 0.40 | 60.00 |
| 2 | 1 | 2 | 0.40 | 2.62 | x | 1.64 | 4.31 | 800.0 | x | 500 | 0.40 | 60.00 |
| 1 | 3 | 3 | 0.60 | 1.31 | x | 4.92 | 6.46 | 400.0 | x | 1500 | 0.60 | 90.00 |
| 2 | 2 | 4 | 0.80 | 2.62 | x | 3.28 | 8.61 | 800.0 | x | 1000 | 0.80 | 120.00 |
| 3 | 2 | 6 | 1.20 | 3.94 | x | 3.28 | 12.92 | 1200.0 | x | 1000 | 1.20 | 180.00 |
| 2 | 4 | 8 | 1.60 | 2.62 | x | 6.56 | 17.22 | 800.0 | x | 2000 | 1.60 | 240.00 |
| 3 | 4 | 12 | 2.40 | 3.94 | x | 6.56 | 25.83 | 1200.0 | x | 2000 | 2.40 | 360.00 |

The invention claimed is:

1. A method for fabricating a solar module assembly, comprising:
   bonding one or more substrates onto a wiring plane to form the solar module assembly, each substrate for manufacturing a plurality of individual photovoltaic cells;
   separating each of the individual photovoltaic cells on the solar module assembly after the bonding; and,
   forming a plurality of contacts on front and back sides of the one or more substrates.

2. The method of claim 1, wherein the bonding comprises electrically bonding between the wiring plane and bond pads located on the one or more substrates.

3. The method of claim 2, wherein the electrical bonding step between the wiring plane and the bond pads is performed by a technique selected from the group consisting of soldering with lead (Pb), soldering without lead (Pb), epoxy, thermal annealing, ultrasonic annealing, and combinations thereof.

4. The method of claim 1, wherein the bonding comprises bonding of protective film to the back side of the wiring plane.

5. The method of claim 1, wherein the wiring backplane comprises conductor patterns, and bonding the one or more substrates onto the wiring plane further comprises arranging the one or more substrates on the wiring plane to align the one or more substrates with the conductor patterns.

6. The method of claim 5, wherein arranging the one or more substrates further comprises a plurality of virtual photovoltaic cells pre-assigned for each of the one or more substrates.

7. The method of claim 1, further comprising forming current collection metal wiring on the one or more substrates.

8. The method of claim 1, further comprising patterning a plurality of features on the one or more substrates.

9. The method of claim 8, wherein the plurality of features is patterned by a technique selected from the group consisting of dry etch, wet etch, laser drilling, chemical mechanical jet etch, and combinations thereof.

10. The method of claim 1, wherein the wiring plane is made of a material selected from the group consisting of metal foil, metal thick film, and combinations thereof.

11. The method of claim 1, wherein each of the individual photovoltaic cells on the solar module assembly is separated without cutting the wiring plane.

12. The method of claim 1, further comprising bonding the solar module assembly with one or more protection films.

13. The method of claim 12, wherein the protection film comprises poly-vinyl fluoride.

14. The method of claim 1, further comprising bonding the solar module assembly with one or more adhesive layers and covering the solar module assembly with solar grade cover glass.

15. The method of claim 1, wherein the bonding the one or more substrates onto a wiring plane includes using adhesive layers comprising ethylene vinyl acetate (EVA).

16. A method for fabricating a solar module assembly, comprising:
   bonding one or more substrates onto a wiring plane comprising conductor patterns, each substrate for manufacturing a plurality of photovoltaic cells;
   arranging the one or more substrates on the wiring plane to align the one or more substrates with the conductor patterns for the plurality of photovoltaic cells to form the solar module assembly; and
   separating each of the individual photovoltaic cells on the solar module assembly after the bonding.

17. The method of claim 16, wherein arranging the one or more substrates further comprises a plurality of virtual photovoltaic cells pre-assigned for each of the one or more substrates.

18. The method of claim 16, further comprising forming a plurality of contacts on the one or more substrates.

19. A method for fabricating a solar module assembly, comprising:
   patterning a plurality of features on one or more substrates;
   forming a plurality of contacts on the one or more substrates;
   forming current collection metal wiring on the one or more substrates;
   bonding the one or more substrates onto a wiring plane to form the solar module assembly, each substrate for manufacturing a plurality of photovoltaic cells; and
   separating each of the individual photovoltaic cells on the solar module assembly, after the bonding.

20. The method of claim 19, further comprising bonding the solar module assembly with one or more protection films.

21. The method of claim 19, further comprising bonding the solar module assembly with one or more adhesive layers and covering the solar module assembly with solar grade cover glass.

* * * * *

UNITED STATES PATENT AND TRADEMARK OFFICE
CERTIFICATE OF CORRECTION

PATENT NO.         : 7,759,158 B2                                       Page 1 of 1
APPLICATION NO.    : 11/367068
DATED              : July 20, 2010
INVENTOR(S)        : Bachrach et al.

It is certified that error appears in the above-identified patent and that said Letters Patent is hereby corrected as shown below:

In the Claims:

Column 11, Claim 3, Line 20, please delete "step";

Column 11, Claim 5, Line 27, please delete "backplane" and insert --plane-- therefor.

Signed and Sealed this

Ninth Day of November, 2010

David J. Kappos
*Director of the United States Patent and Trademark Office*